(12) United States Patent
Eaton

(10) Patent No.: US 6,753,694 B2
(45) Date of Patent: Jun. 22, 2004

(54) SINGLE EVENT UPSET IMMUNE LOGIC FAMILY

(75) Inventor: Harry A. Eaton, Columbia, MD (US)

(73) Assignee: The Johns Hopkins University, Baltimore, MD (US)

( * ) Notice: Subject to any disclaimer, the term of this patent is extended or adjusted under 35 U.S.C. 154(b) by 21 days.

(21) Appl. No.: 10/320,137

(22) Filed: Dec. 16, 2002

(65) Prior Publication Data

US 2003/0122571 A1 Jul. 3, 2003

Related U.S. Application Data

(62) Division of application No. 09/960,581, filed on Sep. 21, 2001, now abandoned.
(60) Provisional application No. 60/236,851, filed on Sep. 29, 2000.

(51) Int. Cl.[7] .............................................. H03K 19/003
(52) U.S. Cl. .............................. 326/13; 326/9; 326/112; 326/119
(58) Field of Search ............................... 326/9, 10, 13, 326/112, 119, 121

(56) References Cited

U.S. PATENT DOCUMENTS

| | | | |
|---|---|---|---|
| 5,311,070 A | 5/1994 | Dooley | 307/279 |
| 5,418,473 A | 5/1995 | Canaris | 326/27 |
| 6,198,334 B1 * | 3/2001 | Tomobe et al. | 327/391 |
| 6,278,287 B1 * | 8/2001 | Baze | 326/9 |
| 6,377,097 B1 | 4/2002 | Shuler, Jr. | 327/208 |

* cited by examiner

*Primary Examiner*—Anh Q. Tran
(74) *Attorney, Agent, or Firm*—Albert J. Fasulo, II

(57) ABSTRACT

A collection of logic gates that provide single event upset (SEU) immunity. The family of gates include an inverter, a two-input NOR gate, a two-input NAND gate, a three-input AND-NOR gate, and a three-input OR-NAND as well as a static RAM bit cell. SEU immunity is obtained by constructing each logic element with a redundant set of inputs and using two copies of each such logic element to provide redundant outputs. The design of a logic element is such that when the redundant inputs agree (i.e., each has the same logic value), then the output of the logic element implements the logic function. However, when any pair of redundant inputs disagree, then the output of the logic element is disconnected (tri-state), which preserves the previous output value. SEU events only affect one of the logic elements in the pair, and this upset can not propagate through other logic elements because of the tri-state function.

2 Claims, 2 Drawing Sheets

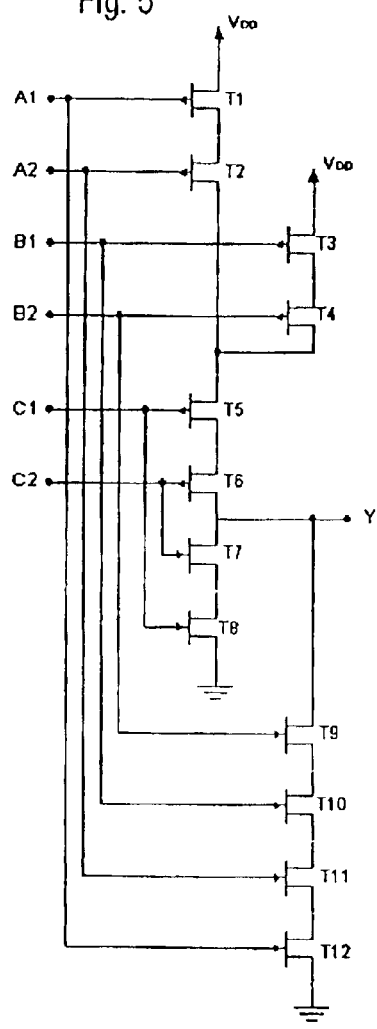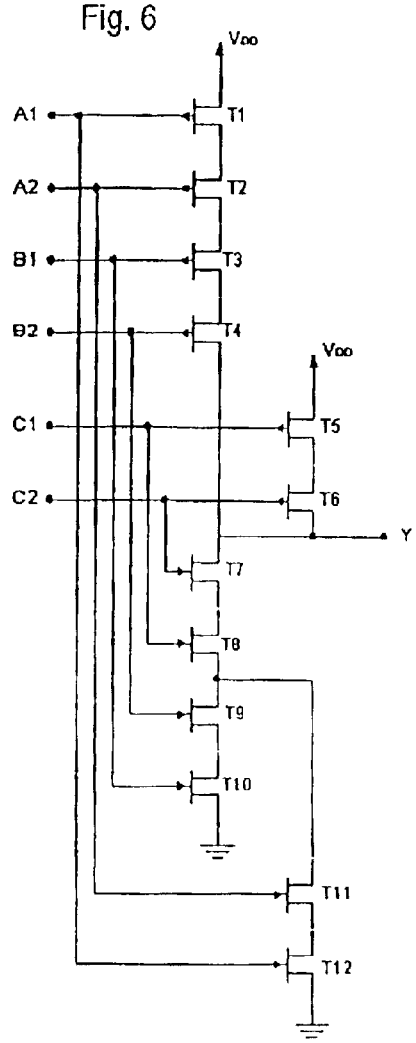

SINGLE EVENT UPSET IMMUNE LOGIC FAMILY

CROSS REFERENCE TO RELATED APPLICATIONS

This application is a division of Ser. No. 09/960,581 filed Sept. 21, 2001 abandoned which is related to and claims the benefit of U.S. Provisional Patent Application Serial No. 60/236,851, filed Sep. 29, 2000 entitled "Single Event Upset Immune Logic Family".

FIELD OF THE INVENTION

The present invention is related to single event upset (SEU) prevention in high density electronic circuits. More particularly, the present invention presents a family of SEU immune logic circuits.

BACKGROUND

Single event upset (SEU) is a phenomenon that sometimes occurs to high density electronics when subjected to radiation fields. When critical dimensions of integrated circuits drop below a certain threshold, Alpha particles and other energetic species impinging on the active integrated circuit or device can cause false bits, lock-up, or catastrophic failure. SEU is a change of state or transient induced by an energetic particle such as a cosmic ray or proton in a device. SEU may occur in digital, analog, and optical components or may have effects in surrounding interface circuitry. This is considered a significant problem in designing electronics for reliable operation in space.

Previous SEU immunity for logic families such as those illustrated in U.S. Pat. No. 5,418,473 have relied on internal feedback and signaling which does not drive from rail-to-rail of the power supplies and is not able to provide strong, symmetrical output drive signals. This results in slow logic operation. The present invention overcomes the aforementioned shortcomings without having to rely on internal feedback designs.

SEU immunity has mainly been emphasized for memory elements. The present invention, however, expands SEU immunity to all logic functions such that upsets can neither propagate through a logic network, nor corrupt memory storage.

SUMMARY

The present invention is comprised of a family of logic gates that provide single event upset (SEU) immunity. SEU immunity is obtained by constructing each logic element with a redundant set of inputs and using two copies of each such logic element to provide redundant outputs. The design of a logic element is such that when the redundant inputs agree (i.e., each has the same logic value), then the output of the logic element implements the logic function. However, when any pair of redundant inputs disagree, then the output of the logic element is disconnected (i.e., tri-state), which preserves the previous output value. Since, SEU events only affect one of the logic elements in the pair, an upset can not propagate through other logic elements because of the tri-state function.

A single event upset (SEU) immune logic function circuit according to the present invention is comprised of a plurality of logic sub-circuits wherein each logic sub-circuit is comprised of redundant inputs. A chosen implementation circuit functions such that when the redundant inputs are not the same the output becomes tri-state and the output from the previous stage is unchanged. Otherwise, when the redundant inputs are the same the output is driven in accordance with the desired logic function.

BRIEF DESCRIPTION OF THE DRAWINGS

FIG. 5 illustrates a three input AND-NOR gate logic circuit in accordance with the present invention.

FIG. 6 illustrates a three input OR-NAND gate logic circuit in accordance with the present invention.

DETAILED DESCRIPTION

Figure 1:
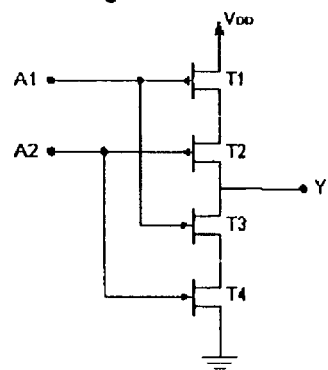
FIG. 1 illustrates an inverter logic circuit in accordance with the present invention.

FIG. 1 illustrates an inverter logic circuit in accordance with the present invention. The inverter is comprised of a pair of p-channel CMOS transistors T1 (primary) and T2 (redundant) and a pair of n-channel CMOS transistors T3 (primary) and T4 (redundant). Gate input A1 to p-channel transistor T1 is cross-coupled to also be an input to n-channel transistor T3. Similarly, redundant gate input A2 to p-channel transistor T2 is cross-coupled to also be an input to n-channel transistor T4.

The source of p-channel transistor T1 is coupled with a power supply $V_{DD}$. The drain of p-channel transistor T1 is coupled with the source of p-channel transistor T2. The drain of p-channel transistor T2 is coupled with the output Y and also with the drain of n-channel transistor T3. N-channel transistor T3 receives its gate input from A1 and its drain is coupled with the output Y. The T3 source is coupled with the drain of n-channel transistor T4. Lastly, n-channel transistor T4 receives its gate input from A2. Its drain is coupled with the source of n-channel transistor T3 and its source is sent to ground.

A truth table for the inverter logic circuit is presented in TABLE 1.

| A1 | A2 | Y |
|---|---|---|
| 0 | 0 | 1 |
| 0 | 1 | Z |
| 1 | 0 | Z |
| 1 | 1 | 0 |

Whenever the redundant input values A1 and A2 are the same, then the logic function is implemented. However, if redundant inputs A1 and A2 are dissimilar, then the output of the circuit is disconnected (i.e., tri-state) and the previous output value is preserved. A tri-state output is represented in the table using the letter Z.

Figure 2:
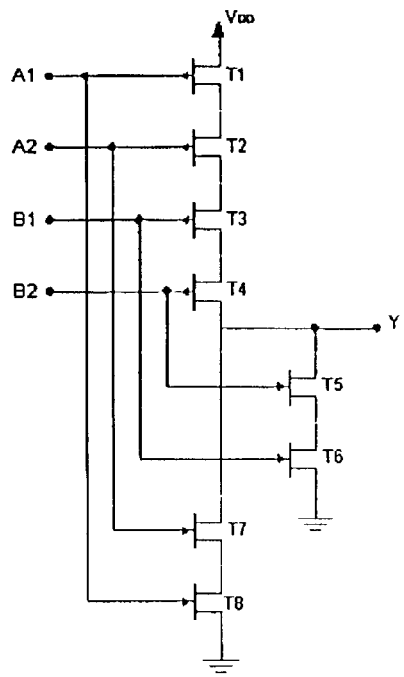
FIG. 2 illustrates a two input NOR gate logic circuit in accordance with the present invention.

FIG. 2 illustrates a two input NOR gate logic circuit in accordance with the present invention. The two input NOR gate is comprised of four p-channel CMOS transistors (T1–T4) and four n-channel CMOS transistors (T5–T8). They are connected as follows. Each of the p-channel transistors (T1, T2, T3, T4) receives an input (A1, A2, B1, B2) at its respective gate. Inputs A1 and B1 are the primary inputs while inputs A2 and B2 are redundant inputs. These inputs are cross coupled with n-channel transistors T5–T8 such that A1 is coupled with T8, A2 is coupled with T7, B1 is coupled with T6, and B2 is coupled with T5.

The source of T1 is coupled with a power supply $V_{DD}$. The drain of T1 is coupled with the source of T2. Similarly, the source of T3 is coupled with the drain of T2 and the source of T4 is coupled with the drain of T3. The drain of T4 is coupled with the output Y. The drain of T5 is also coupled with the output Y. The source of T5 is coupled with the drain of T6 while the source of T6 is coupled with ground. The drain of T7 is coupled with the output Y while the source of T7 is coupled with the drain of T8 and the source of T8 is coupled with ground.

A truth table for the two-input NOR gate logic circuit is presented in TABLE 2.

| A1 | A2 | B1 | B2 | Y |
|----|----|----|----|---|
| X | X | 1 | 1 | 0 |
| 1 | 1 | X | X | 0 |
| 0 | 0 | 0 | 0 | 1 |
| 0 | 0 | 0 | 1 | Z |
| 0 | 0 | 1 | 0 | Z |
| 0 | 1 | 0 | 0 | Z |
| 1 | 0 | 0 | 0 | Z |

A NOR gate sets the output to "0" whenever one of the inputs is "1" regardless of the other input. Thus, in the table above when A1=A2=1 or B1=B2=1, then the output Y is set to "0" regardless of the other input. An "X" as an input value in the table above indicates that any value will suffice, even a corrupted value. The table produces tri-state outputs Z whenever A1≠A2 when B1=B2=0 or B1≠B2 when A1=A2=0. In such cases, the output of the circuit is disconnected and the previous output value is preserved.

Figure 3:
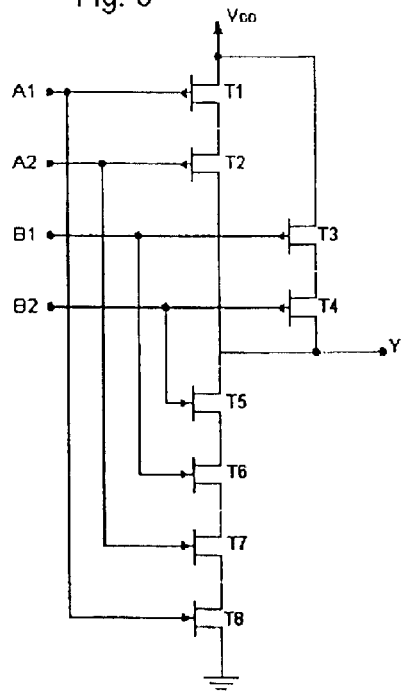
FIG. 3 illustrates a two input NAND gate logic circuit in accordance with the present invention.

FIG. 3 illustrates a two input NAND gate logic circuit in accordance with the present invention. The two input NAND gate is comprised of four p-channel CMOS transistors (T1–T4) and four n-channel CMOS transistors (T5–T8). They are connected as follows. Each of the p-channel transistors (T1, T2, T3, T4) receives an input (A1, A2, B1, B2) at its respective gate. Again, inputs A1 and B1 are the primary inputs while inputs A2 and B2 are redundant inputs. These inputs are cross coupled with n-channel transistors T5–T8 such that A1 is coupled with T8, A2 is coupled with T7, B1 is coupled with T6, and B2 is coupled with T5.

The source of T1 is coupled with a power supply $V_{DD}$. The drain of T1 is coupled with the source of T2. The drain of T2 is coupled with the output Y. The source of T3 is coupled with power supply $V_{DD}$. The drain of T3 is coupled with the source of T4 and the drain of T4 is coupled with the output Y. The drain of n-channel transistor T5 is also coupled with the output Y while the source of T5 is coupled with the drain of T6. The source of T6 is coupled with the drain of T7. The source of T7 is coupled with the drain of T8 and the source of T8 is coupled with ground.

A truth table for the two-input NAND gate logic circuit is presented in TABLE 3.

| A1 | A2 | B1 | B2 | Y |
|----|----|----|----|---|
| 0 | 0 | X | X | 1 |
| X | X | 0 | 0 | 1 |
| 1 | 1 | 1 | 1 | 0 |
| 0 | 1 | 1 | 1 | Z |
| 1 | 0 | 1 | 1 | Z |
| 1 | 1 | 0 | 1 | Z |
| 1 | 1 | 1 | 0 | Z |

A two-input NAND gate will only set the output to "0" when both inputs are "1". Conversely, if their input is "0" then the output will be set to "1" regardless of the other input. Thus, in the table above, if A1=A2=0 or B1=B2=0, then the output Y will be set to "1" regardless of the other input. The output can only be "0" if A1=A2=1 and B1=B2=1. All other combinations will disconnect because A1≠A2 while not B1=B2=0 or B1≠B2 while not A1=A2=0.

Figure 4:
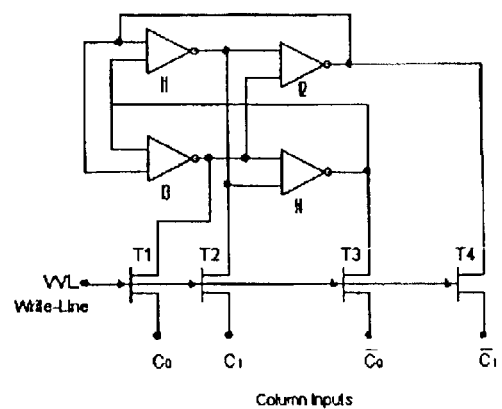
FIG. 4 illustrates a static RAM bit cell logic circuit in accordance with the present invention.

FIG. 4 illustrates a static RAM bit cell logic circuit in accordance with the present invention. The inverters used are those described in FIG. 1 above. Thus, the static RAM bit cell logic circuit is SEU immune because the inverters comprising the circuit are SEU immune. The static RAM bit cell logic circuit includes multiple I/O pins to eliminate the potential of an SEU while reading or writing to the memory cell. This circuit is not an inverter with decoupling transistors in the power supply terminals. Rather, this circuit implements a set of redundant inverter circuits.

FIG. 5 illustrates a three input AND-NOR gate logic circuit in accordance with the present invention. The three input AND-NOR gate is comprised of six p-channel CMOS transistors (T1–T6) and six n-channel CMOS transistors (T7–T12). They are connected as follows. Each of the p-channel transistors (T1, T2, T3, T4, T5, T6) receive an input (A1, A2, B1, B2, C1, C2) at their respective gates. Inputs A1, B1, and C1 are the primary inputs while inputs A2, B2, and C2 are redundant inputs. These inputs are cross coupled with n-channel transistors T7–T12 such that A1 is coupled with T12, A2 is coupled with T11, B1 is coupled with T10, and B2 is coupled with T9, C1 is coupled with T8, and C2 is coupled with T7.

The source of T1 is coupled with a power supply $V_{DD}$ while its drain is coupled with the source of T2. The drain of T2 is coupled with the source of T4. The source of T3 is coupled with power supply $V_{DD}$. The drain of T3 is coupled with the source of T4 while the drain of T4 is coupled with the source of T2. The source of T5 is coupled with the drains of T2 and T4. The drain of T5 is coupled with the source of T6 while the drain of T6 is coupled with the output Y. The drain of n-channel transistor T7 is coupled with the output Y. The source of T7 is coupled with the drain of T8 while the source of T8 is coupled with ground. The drain of T9 is coupled with output Y while its source is coupled with the drain of T10. The source of T10 is coupled with the drain of T11. The source of T11 is coupled with the drain of T12 and the source of T12 is coupled with ground.

A truth table for the three input AND-NOR gate logic circuit is presented in TABLE 4.

| A1 | A2 | B1 | B2 | C1 | C2 | Y |
|----|----|----|----|----|----|---|
| X | X | X | X | 1 | 1 | 0 |
| 1 | 1 | 1 | 1 | X | X | 0 |
| X | X | 0 | 0 | 0 | 0 | 1 |
| 0 | 0 | X | X | 0 | 0 | 1 |
| ALL OTHERS | | | | | | Z |

A three input AND-NOR gate performs an AND function on inputs A and B and then performs a NOR function on input C and the output of the A/B AND. Since a NOR gate sets the output to "0" whenever one of the inputs is "1" regardless of the other input, the output of the AND function is irrelevant if C1=C2=1. Similarly, if the output of the AND operation yields a 1 (i.e., A1=A2=1 and B1=B2=1), then the values of C1 and C2 are irrelevant. A NOR gate can only return a "1" when both inputs are "0". Thus, if C1=C2=0 and if A1=A2=0 or B1=B2=0, then the AND-NOR output Y will be "1". All other combinations will cause a tri-state disconnect.

FIG. 6 illustrates a three input OR-NAND gate logic circuit in accordance with the present invention. The three input OR-NAND gate is comprised of six p-channel CMOS transistors (T1–T6) and six n-channel CMOS transistors (T7–T12). They are connected as follows. Each of the p-channel transistors (T1, T2, T3, T4, T5, T6) receives an input (A1, A2, B1, B2, C1, C2) at its respective gate. Again, inputs A1, B1, and C1 are the primary inputs while inputs A2, B2, and C2 are redundant inputs. These inputs are cross coupled with n-channel transistors T7–T12 such that A1 is coupled with T12, A2 is coupled with T11, B1 is coupled with T10, and B2 is coupled with T9, C1 is coupled with T8, and C2 is coupled with T7.

The source of T1 is coupled with a power supply $V_{DD}$ while its drain is coupled with the source of T2. The drain of T2 is coupled with the source of T3. The drain of T3 is coupled with the source of T4. The drain of T4 is coupled with the output Y. The source of T5 is coupled with power supply $V_{DD}$. The drain of T5 is coupled with the source of T6 while the drain of T6 is coupled with the output Y. The drain of T7 is coupled with the output Y. The source of T7 is coupled with the drain of T8. The source of T8 is coupled with the drain of T9. The source of T9 is coupled with the drain of T10 while the source of T10 is coupled with ground. The drain of T11 is coupled with the source of T8 and the drain of T9 while the source of T11 is coupled with the drain of T12. The source of T12 is coupled with ground.

A truth table for the three input OR-NAND gate logic circuit is presented in TABLE 5.

| A1 | A2 | B1 | B2 | C1 | C2 | Y |
|----|----|----|----|----|----|---|
| X | X | X | X | 0 | 0 | 1 |
| 0 | 0 | 0 | 0 | X | X | 1 |
| X | X | 1 | 1 | 1 | 1 | 0 |
| 1 | 1 | X | X | 1 | 1 | 0 |
| ALL OTHERS | | | | | | Z |

A three input OR-NAND gate performs an OR function on inputs A and B and then performs a NAND function on input C and the output of the A/B OR. Since a NAND function will return a "1" only when one of the inputs is a "0", the OR-NAND gate will return a "1" when either C1=C2=0 or when A1=A2=0 and B1=B2=0. The OR-NAND gate will return a "0"C1=C2=1 and either A1=A2=1 or B1=B2=1. All other combinations will cause a tri-state disconnect.

The present invention has been illustrated using CMOS transistor logic. Other forms of transistor logic, however, could be used with the concepts of the present invention. Thus, the present invention is not limited to CMOS transistor logic only. Moreover, the present invention has illustrated a family of gates that include an inverter, a two-input NOR gate, a two-input NAND gate, a three-input AND-NOR gate, and a three-input OR-NAND. The present invention is not limited to this particular family. The concepts of the present invention can be applied by those of ordinary skill in the art to achieve SEU immunity for other logic functions.

In the following claims, any means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A single event upset (SEU) immune three-input AND-NOR circuit comprising:
   primary p-channel CMOS transistors, T1, T3 and T5, and redundant p-channel CMOS transistors, T2, T4 and T6; and
   primary n-channel CMOS transistors, T8, T10 and T12, and redundant n-channel CMOS transistors, T7, T9 and T11;
   wherein each transistor is comprised of a gate, a source, and a drain and said transistors are coupled such that,
   a first primary input, A1, is coupled with the gate of T1 and the gate of T12;
   a first redundant input, A2, is coupled with the gate of T2 and the gate of T11;
   a second primary input, B1, is coupled with the gate of T3 and the gate of T10;
   a second redundant input, B2, is coupled with the gate of T4 and the gate of T9;
   a third primary input, C1, is coupled with the gate of T5 and the gate of T8;
   a third redundant input, C2, is coupled with the gate of T6 and the gate of T7;
   the source of T1 is coupled with a power supply;
   the drain of T1 is coupled with the source of T2;
   the drain of T2 is coupled with the drain of T4;
   the source of T3 is coupled with the power supply;
   the drain of T3 is coupled with the source of T4;
   the drain of T4 is coupled with the drain of T2;
   the source of T5 is coupled with the drain of T2 and the drain of T4;
   the drain of T5 is coupled with the source of T6;
   the drain of T6 is coupled with an output, Y;
   the drain of T7 is coupled with the output, Y;
   the source of T7 is coupled with the drain of T8;
   the source of T8 is coupled with ground;
   the drain of T9 is coupled with the output, Y;
   the source of T9 is coupled with the drain of T10;
   the source of T10 is coupled with the drain of T11;
   the source of T11 is coupled with the drain of T12; and
   the source of T12 is coupled with ground.

2. A single event upset (SEU) immune three-input OR-NAND circuit comprising:
   primary p-channel CMOS transistors, T1, T3 and T5, and redundant p-channel CMOS transistors, T2, T4 and T6; and
   primary n-channel CMOS transistors, T8, T10 and T12, and redundant n-channel CMOS transistors, T7, T9 and T11;

wherein each transistor is comprised of a gate, a source, and a drain and said transistors are coupled such that, a first primary input, A1, is coupled with the gate of T1 and the gate of T12;

a first redundant input, A2, is coupled with the gate of T2 and the gate of T11;

a second primary input, B1, is coupled with the gate of T3 and the gate of T10;

a second redundant input, B2, is coupled with the gate of T4 and the gate of T9;

a third primary input, C1, is coupled with the gate of T5 and the gate of T8;

a third redundant input, C2, is coupled with the gate of T6 and the gate of T7;

the source of T1 is coupled with a power supply;

the drain of T1 is coupled with the source of T2;

the drain of T2 is coupled with the source of T3;

the drain of T3 is coupled with the source of T4;

the drain of T4 is coupled with an output, Y;

the source of T5 is coupled with the power supply;

the drain of T5 is coupled with the source of T6;

the drain of T6 is coupled with the output, Y;

the drain of T7 is coupled with the output, Y;

the source of T7 is coupled with the drain of T8;

the source of T8 is coupled with drain of T11;

the drain of T9 is coupled with the drain of T11;

the source of T9 is coupled with the drain of T10;

the source of T10 is coupled with ground;

the drain of T11 is coupled with the source of T8 and the drain of T9; and the source of T11 is coupled with drain of T12; and the source of T12 is coupled with ground.

\* \* \* \* \*